United States Patent [19]

Sutherland et al.

[11] 4,209,240
[45] Jun. 24, 1980

[54] RETICLE EXPOSURE APPARATUS AND METHOD

[75] Inventors: Ivan E. Sutherland, Santa Monica; Charles L. Seitz, San Luis Rey, both of Calif.

[73] Assignee: California Institute of Technology, Pasadena, Calif.

[21] Appl. No.: 949,756

[22] Filed: Oct. 10, 1978

[51] Int. Cl.² ............................................. G03B 41/00
[52] U.S. Cl. ...................................................... 354/4
[58] Field of Search ................ 354/4; 83/292; 33/1 M, 33/32 F; 248/583

[56] References Cited

U.S. PATENT DOCUMENTS

| | | | |
|---|---|---|---|
| 3,181,170 | 4/1965 | Akin | 346/108 |
| 3,797,935 | 3/1974 | Marcy | 354/4 X |
| 3,903,536 | 9/1975 | Westerberg | 354/4 |
| 3,925,785 | 12/1975 | Firtion et al. | 354/4 X |
| 3,927,211 | 12/1975 | Lee et al. | 354/4 |

*Primary Examiner*—Michael L. Gellner
*Attorney, Agent, or Firm*—Freilich, Hornbaker, Wasserman, Rosen & Fernandez

[57] ABSTRACT

An apparatus and method are described for applying a light beam in an extremely precise pattern to a work piece, such as a photographic plate or reticle on which an integrated circuit pattern is to be formed and which will be then utilized to produce integrated circuits. The method includes moving a very narrow beam light source relative to the reticle in a scanning pattern such as an X-Y raster pattern, accurately sensing the relative positions of the light source to the reticle as by the use of laser interferometers, and briefly energizing the light source only when it lies at the locations to be exposed. The light source is energized while it moves, so it is not necessary to stop the light source at precisely located positions. The light source can be moved relative to the reticle, by mounting the light source on a flexible plate that oscillates in substantially a straight line, and by mounting the reticle on another flexible plate that moves perpendicular to the light source and that can be very slowly advanced perpendicular to the oscillating light source, so that after a period of time the light source has moved over every point of the reticle, although only a minority of the points normally will have been exposed.

12 Claims, 10 Drawing Figures

RETICLE EXPOSURE APPARATUS AND METHOD

ORIGIN OF THE INVENTION

The U.S. government has rights in this invention pursuant to contract no. N0039-77-C0185 awarded by Advanced Research Projects Agency and contract no. N00014-76-C-1089 awarded by the Office of Naval Research.

BACKGROUND OF THE INVENTION

Medium and large scale integrated circuits are commonly formed by the use of groups of photographic plates, often referred to as reticles, which carry photographic images of the different layers of the circuit. Each reticle, which may be five inches square, is typically ten times as large as the integrated circuit to be formed, and a group of perhaps eight reticles may be utilized to define all of the layers of an integrated circuit. The reticles are utilized to make master plates that are used to form the masks utilized in the actual construction of the integrated circuits.

A common technique for producing reticles involves the use of extremely precise mechanisms for moving a reticle holding table in X and Y motions. A computer tape which defines different rectangular areas of the integrated circuit, is utilized to adjust pairs of shutters through which light is directed to fall on the photosensitive reticle. By adjusting the width and length of the rectangular area between shutters, and by adjusting the position of the reticle, a series of many rectangular areas can be formed on the reticle to define the integrated circuit layer. Such equipment is expensive, largely because the reticle must be located with great precision. Also, the circuit must be formed of rectangular areas, which is not always the most efficient form. Although small rectangular areas can be built up to approximate curves, this can greatly increase the time required to form a circuit. The time is considerable, since it may require perhaps one hour to construct each reticle for an integrated circuit of only moderate complexity. An electron beam device with deflection coils has been utilized to record images, but such a particle beam system must be operated in a vacuum, which makes the system costly and cumbersome. A method and apparatus for exposing a reticle, or for any other application in which a precise detailed pattern of light energy was to be applied, which could be constructed at lower cost and operated with ease, would reduce the cost of constructing integrated circuits or any other device utilizing precision patterns.

SUMMARY OF THE INVENTION

In accordance with one embodiment of the present invention, a method and apparatus are provided for directing a light source in a precise and detailed pattern onto a work piece, utilizing an apparatus which can be constructed at moderate cost to generate a very precise pattern. The method and apparatus are especially useful in the production of reticles utilized in the manufacture of integrated circuits. The method includes moving a light source relative to a substrate such as a reticle, in a scanning pattern such as an X-Y raster, accurately sensing the relative position of the light source to the substrate, and energizing the light source when it lies over the selected locations of a substrate that are to be exposed.

The light source is energized while it continues to move relative to the substrate, so that it is not necessary to stop the relative movement at precise locations, but only that the light source pass all of the locations to be exposed. This can be accomplished by moving the light source relative to the substrate in a scanning pattern such as an X-Y raster, to cover all areas of the substrate or of major portions thereof, even though the light source is not energized at most of the locations it traverses. In this manner, it is not necessary to precisely locate the light source with respect to the substrate, but only to precisely sense their relative positions, so that the equipment necessary for exposing the substrate can be constructed at a more modest cost.

The apparatus for moving the light source relative to the substrate, can include a pair of resilient beams or flexures, with the light source mounted at the end of a first flexure that oscillates along a substantially line path, and the substrate held at the end of the other flexure to move along a substantially line path extending perpendicular to the motion of the light source. The flexures permit movement with substantially no bearing noise, which might otherwise occur with sliding or true rotation joints. One of the devices such as the light source can be allowed to merely oscillate at the end of its flexure, while the other device such as the substrate can be very slowly advanced along its line path, to generate an X-Y raster pattern that covers the entire substrate surface. Laser interferometers can be utilized to very accurately sense the X and Y positions of the light source and substrate relative to one another. The positions sensed by the interferomic system can be delivered to a computer which compares the sensed positions to the positions on a look-up table containing all the positions on the substrate which are to be exposed. Whenever the sensed position matches a position in the look-up table, the computer can cause the light source to be briefly energized.

The novel features of the invention are set forth with particularity in the appended claims. The invention will be best understood from the following description when read in conjunction with the accompanying drawings.

DESCRIPTION OF THE PREFERRED EMBODIMENTS

Figure 1:
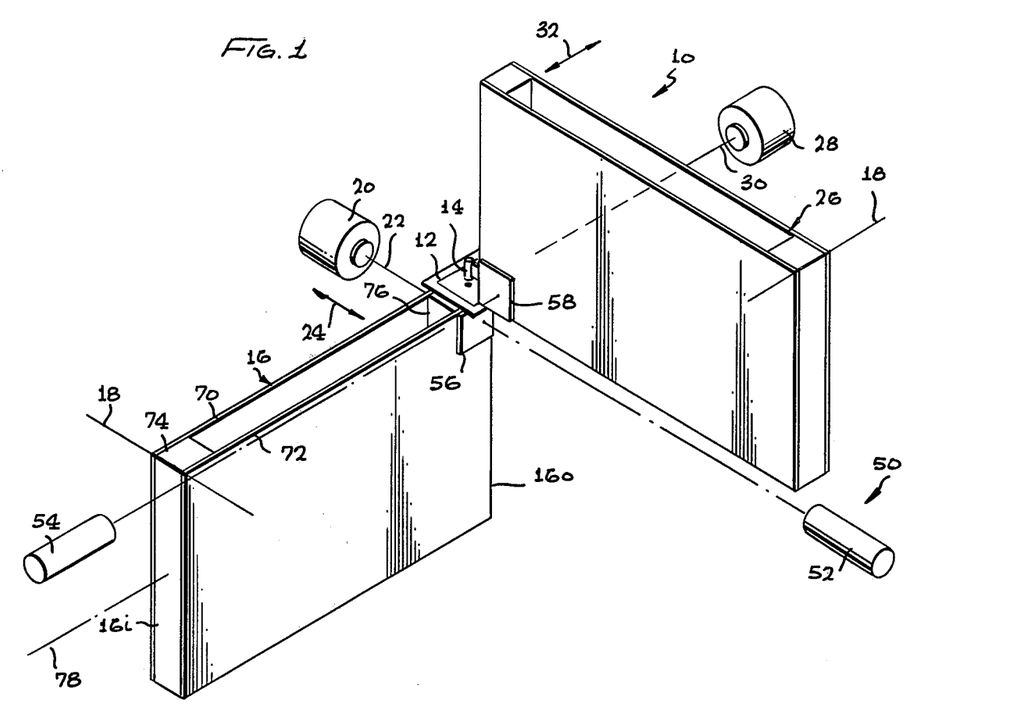
FIG. 1 is a simplified perspective view of an exposure apparatus constructed in accordance with one embodiment of the present invention.
Figure 2:
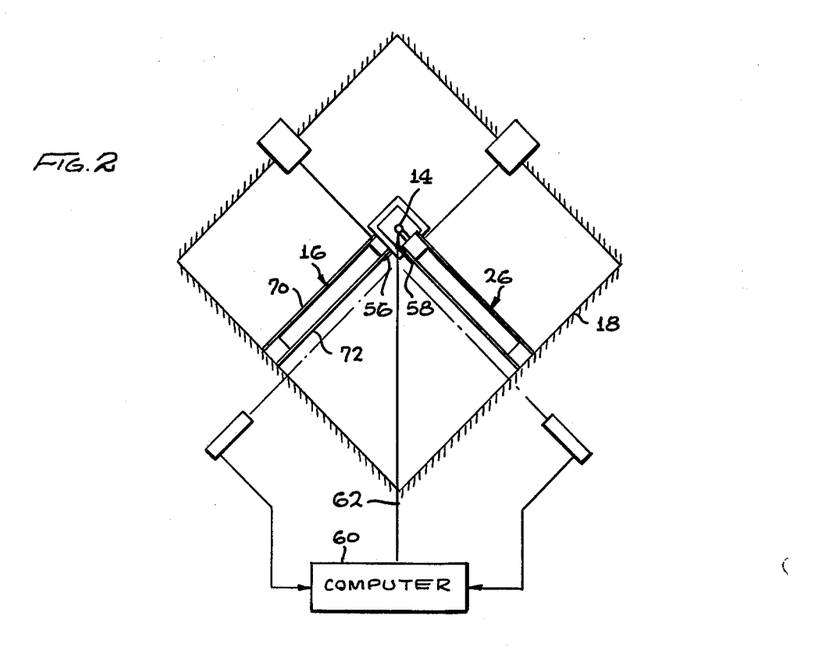
FIG. 2 is a plan view of the apparatus of FIG. 1.

FIGS. 1 and 2 illustrate an apparatus 10 for holding a substrate 12 and a light source 14 and moving them relative to one another. The substrate 12 may be a glass plate containing a photographic emulsion, and which, after exposure and development, will serve as a reticle in the production of integrated circuits. The light source 14 is constructed to produce a very narrow light beam when it is energized, to expose very small areas of the substrate. The substrate 12 is mounted at the outer end of a flexure structure 16 whose inner end is fixed to a stationary frame indicated at 18. A linear motor 20 attached by a wire 22 to the outer end of the flexing structure, can pull and release the flexure structure to permit the substrate 12 to move in the direction indicated by arrows 24. In a similar manner, the light source 14 is attached to the outer end of another flexure structure 26 whose inner end is fixed to the frame 18. A second linear motor 28 which is attached by a wire 30 to the outer end of the second flexure structure 26, can pull and release the second flexure structure to cause it to move in the direction of arrows 32. Thus, the substrate 12 moves in one direction 24 while the light source 14 moves in a perpendicular direction 32. By properly driving the linear motors 20, 28, the light source 14 can be made to direct its narrow beam against any point on the substrate 12 to expose that point.

Figure 4:
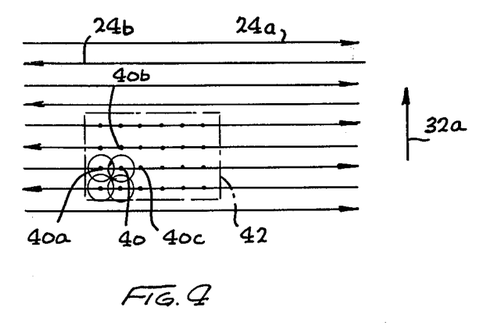
FIG. 4 is a representation of the exposure method of the present invention.

The exposure of a reticle substrate, or reticle 12 must be accomplished with great precision and fine detail. All of the locations on the reticle which must be exposed, can be exposed by moving the light source 14 relative to the substrate 12 in a scanning pattern that causes the light source to pass over, or opposite, all locations of the substrate. This can be accomplished by oscillating the substrate 12 in the direction of arrows 24, so that the light source 14 passes repeatedly across the width of the reticle 12. At the same time, the light source 14 can be very slowly advanced in the direction of one of the arrows 32. FIG. 4 illustrates an X-Y scanning raster that can be generated by oscillating the reticle in the direction of the arrows 24a, 24b, while at the same time advancing the light source in the direction of arrow 32a, so that the light source advances in a raster pattern over the entire reticle area. When the light source reaches a point such as 40 which should be exposed, the light source is flashed on for an instant to expose the point 40. In order to expose a large area such as the rectangle indicated at 42, the light source can be kept on during the period it traverses the width of the rectangle, or can be flashed on in successive pulses and with the light source having a sufficient diameter so that the successive pulses overlap to expose a continuous area. In any case, the exposure of the reticle occurs while the light source 14 moves relative to the substrate 12.

The positions of the light source 14 and of the reticle 12 along their respective paths, is sensed with great precision at all times by an interferometer system 50 (FIG. 1) that includes a pair of interferometers 52, 54 which direct light beams against a pair of mirrors 56, 58 that are fixed with respect to the reticle 12 and light source 14, respectively. Each interferometer such as 52 includes a laser light source and an interference sensing device of a type well known in the art. The outputs of the two interferometers 52, 54, which represent the positions of the reticle 12 and light source 14, are delivered to a computer 60 (FIG. 2). Whenever the computer senses that the light source 14 is at a position (in both X and Y coordinates) relative to the reticle at which the reticle should be exposed, the computer delivers a pulse over a line 62 to the light source 14 to briefly energize it.

Thus, the system of FIGS. 1 and 2 does not rely upon accurate positioning of the light source 14 with respect to the substrate or reticle 12 to enable exposure of the reticle with high precision, but instead relies upon accurate sensing of the relative light source position, and upon a circuit for energizing the light source at certain predetermined positions. Accordingly, it is not necessary for both of the flexure structures 16, 26 to be movable with great precision, and in particular the flexure structure 16 which merely oscillates and the linear motor 20 which oscillates it, do not have to be precise. The other flexure structure 26 and motor 28 are preferably precise, to the extent that they have little noise, to minimize the skipping of scan lines. However, even if they are imprecise, no damage occurs to the reticle, but it is merely necessary to reposition the flexure structure 26 to again try to expose along a scan line. In other words, errors will cost some time, but will not be recorded on the reticle.

Although the flexure structures 16, 26 which support the reticle 12 and light source 14 do not have to be constructed for accurate motion in a line, it is important that the flexures be devoid of bearing noise. For example, if one of the movable objects such as the reticle 12 were mounted on a sliding guideway, then great care would have to be taken that the guideway did not deflect the reticle sidewardly (in the direction of arrows 32) along its path by even a small amount such as a large fraction of a thousandth of an inch. Any such unpredictable sideward deflection could result in the X-Y scanning raster having gaps in it. For example, in FIG. 4, if the light source had just finished exposing point 40a and then in moving towards point 40 were diverted in the direction of arrow 32a to the point 40b, then the point 40 might never be exposed. This would leave a gap in the raster, and therefore a possible gap in the image to be exposed. The use of the flexure structures 16, 26 which include flexing beams, avoids rubbing contact guideways that could generate bearing noise to cause gaps in the scanning pattern. As will be described below, the locations to be exposed must be known with a high precision such as on the order of one micron (about 0.00004 inch) and therefore the avoidance of even slight bearing noise is desirable.

Each of the flexures such as 16, includes two parallel flexure members 70, 72 whose inner ends are fixed together against shifting and rotation by a block 74, and whose outer ends are similarly fixed together by another block 76. The blocks 74, 76 maintain the inner and outer ends 16i, 16o substantially parallel to one another despite flexing of the flexible structure 16. This is important in minimizing turning of the mirror 56. The two flexure plates 70, 72 have a large height, to resist twisting about the axis 78. While the flexure structures 16, 18 are resistant to turning of the mirrors 56, 58 they are only moderately resistant. The resistance to torsion, or rotation about the axis 78, decreases as the outer flexure end 16o becomes displaced from its central position. If the flexure members 70, 72 are of slightly different lengths, then their outer ends will rotate slightly, although this effect can be minimized by increasing the spacing of the parallel flexure members. It also may be noted that the outer ends of each flexure structure such as 16 moves in a curved path, with a deviation of 0.6 d/D from a straight line, where d is the amount of the deflection (along arrows 24) from the central position and D is the length of the flexure between its inner and outer ends.

Figure 3:
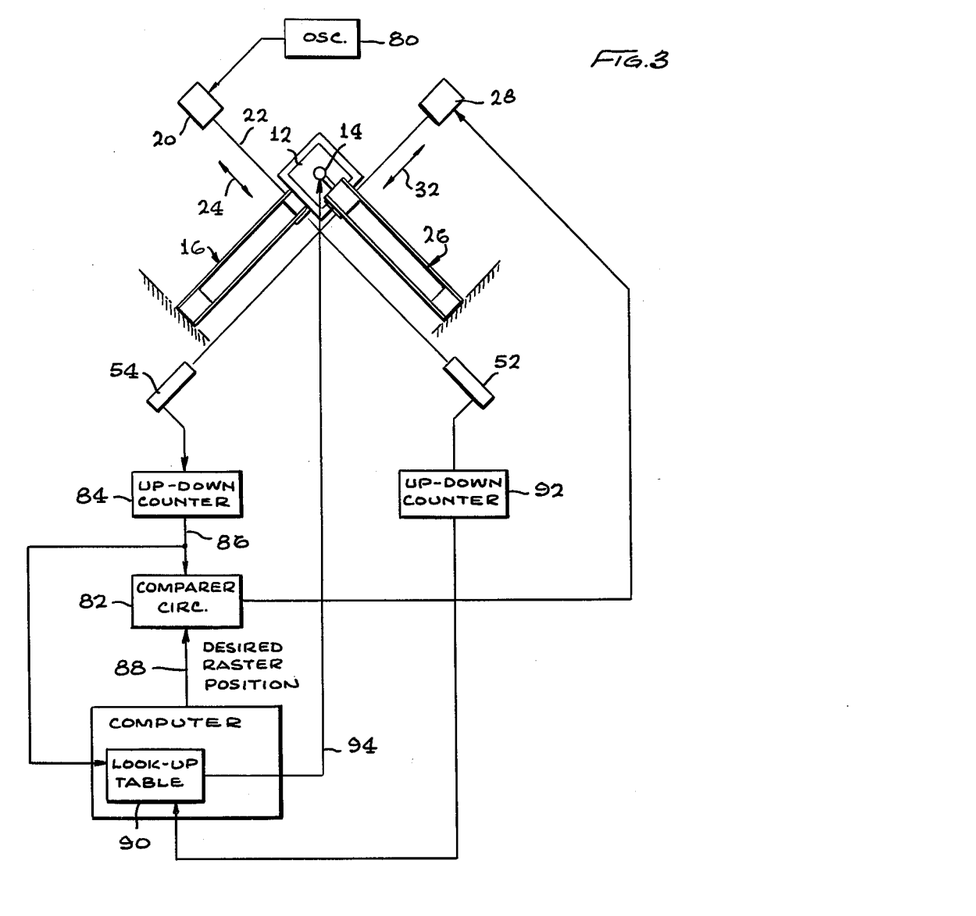
FIG. 3 is a view similar to that of FIG. 2, but showing the circuit in greater detail.

FIG. 3 shows the circuitry for operating the device of FIG. 2, in somewhat greater detail. The linear motor 20 which oscillates the substrate or reticle 12, may be a voice coil motor driven by a low-frequency oscillator 80 which delivers a current of a frequency such as 1 Hz. to the motor to cause it to slowly oscillate the reticle in the direction of the arrows 24. The other linear motor 28, which must advance the light source 14 very slowly, is driven by the output of a comparer circuit 82. The interferometer 54 which senses the position of the light source along the direction of arrows 32, delivers its output to an up-down counter 84 which delivers a count over 86 defining the Y position, in the direction of arrows 32, of the light source. This count is delivered to the comparer circuit, which also receives a count over a line 88 from the computer that indicates the desired position of the light source. For example, where each count represents a movement of ten microns, the computer may advance the count by 1 after every oscillation of the oscillator 80 (provided all points along the previous scan line were successfully recorded), so that the raster pattern advances by a distance of ten microns after every sweep across the width of the substrate. The count in the counter 84 is also delivered to a memory means in the form of a look-up table 90 in the computer. The other interferometer 52 drives another counter 92 whose output, representing the X direction or direction along the arrow 24 of the reticle, is delivered to the look-up table 90. When the two counts, representing the coordinates of a reticle point lying opposite the light source 14, correspond to a point on the desired reticle which should be exposed, the computer delivers a pulse over line 94 to the light source 14 to briefly energize it.

Figure 5:
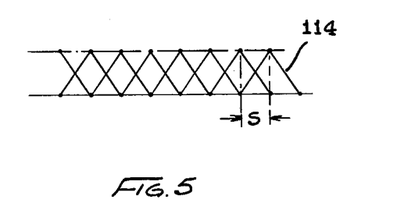
FIG. 5 is a graph showing the cumulative effects of the exposure method of FIG. 4.
Figure 6:
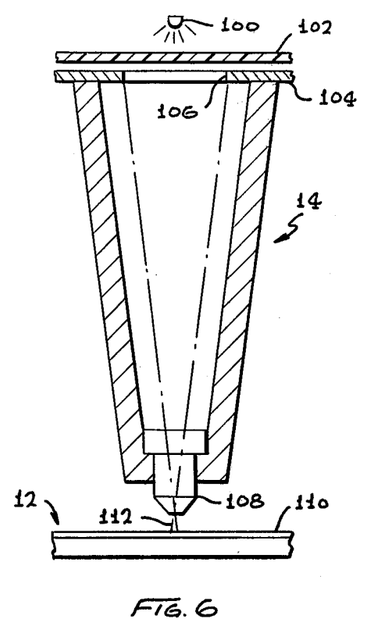
FIG. 6 is a partial elevation view of a light source of the apparatus of FIG. 1.

The narrow beam light source utilized to expose the reticle can be constructed as shown in FIG. 6, wherein the light source 14 includes a light emitting diode 100 whose light is directed through a diffuser 102 and through an aperture plate 104 having an aperture 106 therein. The light passing through the aperture 106 is concentrated by a microscope lens 108 onto the photographic emulsion layer 110 of the reticle 12. This arrangement provides a relatively low cost narrow beam light source. The fact that the light originates from the LED 100 means that rapid switching on and off of the light source can be achieved, since LEDs are readily available which have very rapid switching times such as on the order of 100 nanoseconds. The light beam 112 which is directed onto the reticle, has a triangular distribution of light such as that shown at 114 in FIG. 5, wherein each triangle represents the light distribution of the light beam 112 when the center of the beam is directed at the location of the apex of the triangle. When the light is pulsed on for a very brief time, the light energy reaching the emulsion is a substantially triangular function as illustrated at 114. When adjacent points spaced a distance s apart are exposed in succession, where the spacing s represents the spacing between adjacent points in FIG. 4 such as between points 40a and 40, the total light energy reaching all locations in between the points is substantially uniform. Thus, a substantially uniform exposure of a considerable area of the reticle plate can be achieved by pulsing the light source on at points spaced by the distance s apart that are distributed over the area to be exposed. Of course, the light source could include a lamp that is left on, and a shutter that opens briefly, so that energization of the light source causes opening of a shutter that is part of the light source, although energization of an LED is simple.

The use of light pulses that are brief enough that the reticle does not move significantly during the pulse, can simplify the required programming of the computer. If the light source were to be left on continually during passage over a large reticle area to be exposed, then it might also be necessary to compute the path of the light source so as to turn it off as it is approaching a point which will not be exposed.

Figure 7:
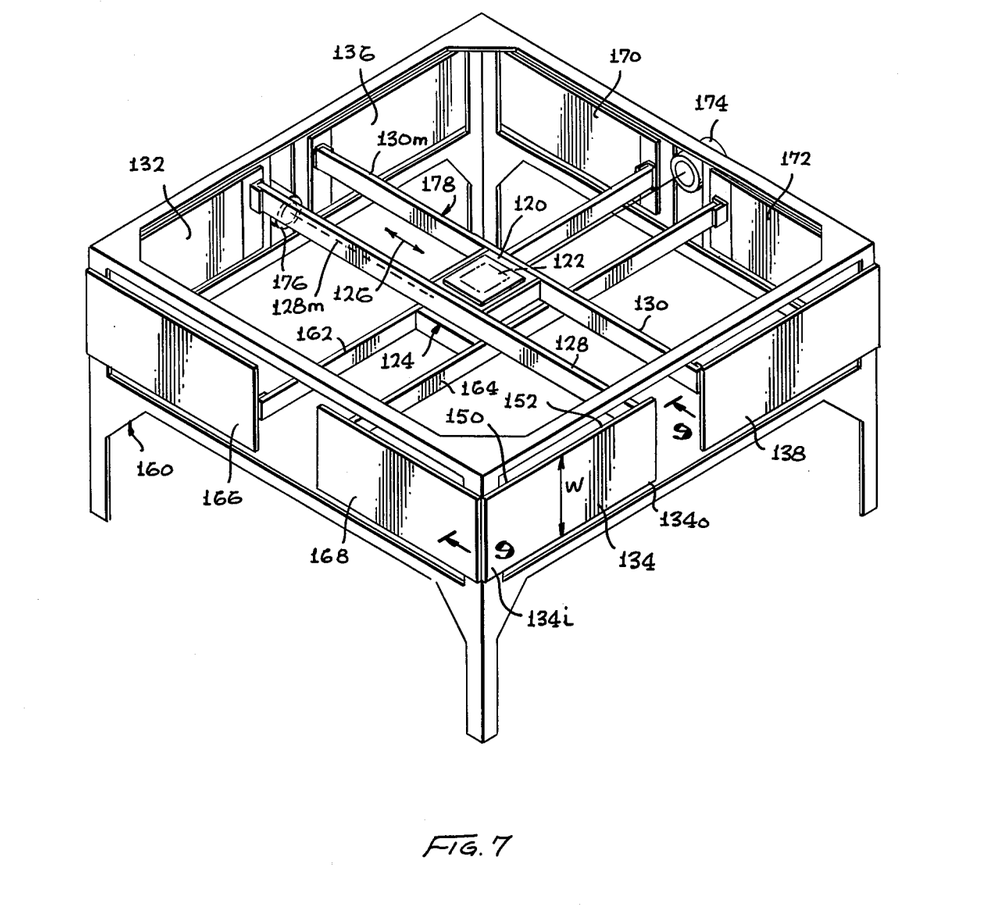
FIG. 7 is a partial perspective view of an exposure apparatus constructed in accordance with another embodiment of the present invention.

The flexure structures that support the reticle and light source preferably should move the reticle and light source in straight lines extending perpendicular to one another, without rotation about any axis. Small deviations from most of these conditions does not have an important effect upon the accuracy of the final reticle, since the interferometer measuring apparatus can still measure the actual positions of the reticle with respect to the light source. One factor that has been found important is that the separation between the light source and reticle (along a Z axis perpendicular to the X and Y axes) be maintained constant with high precision, to avoid an appreciable variation in light beam diameter. Precise maintenance of separation is also important in avoiding error between the actual and calculated beam position if the light source is not directed precisely perpendicular to the surface of the reticle, which can result not only from initial misalignment of the light source but also from slight tilting of the light source or reticle as it moves. FIG. 7 illustrates a support apparatus which controls the motion of the light source and reticle so that they move more precisely in straight lines perpendicular to one another, while resisting rotation of either of them.

The structure of FIG. 7 includes a reticle platform 120 for holding a reticle 122 to be exposed, and a light source platform 124 for holding a light source of the type shown in FIG. 6 (but which is oriented upside down from the position of FIG. 6). It may be noted that the reticle lies on the underside of the upper platform 120 to face downwardly, so that it is less subject to contamination by dust particles. Each of the platforms 120, 124 is similarly mounted. Platform 120 which is designed to move in the direction of arrows 126, is fastened to the middle of a pair of resilient connector beams 128, 130. The connector beam 128 extends between and is supported at the outer ends of a pair of resilient sheetlike flexures 132, 134 that extend parallel to one another and lie opposite each other. The other connector beam 130 is similarly supported by a pair of flexures 136, 138 that lie opposite each other.

Figure 8:
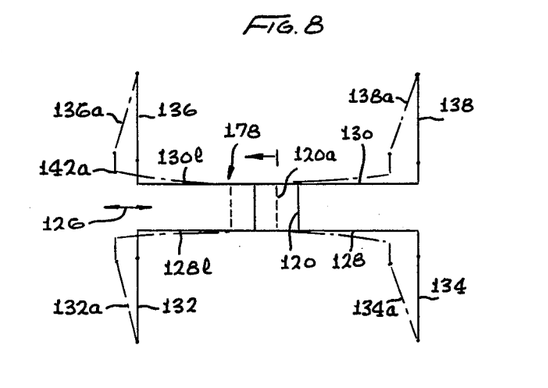
FIG. 8 is a partial representational view of the apparatus of FIG. 7.

FIG. 8 illustrates the manner of operation of the support structure of FIG. 7. When the platform 120 moves to the left in FIG. 8 to the position 120a, the two connector beams move to the left and cause the flexures to deflect to the positions shown at 132a, 134a, 136a and 138a. The outer ends of the flexures move in substantially circular paths, so that, for example, the outer ends of the two beams 132, 136 move slightly further apart when they are deflected from their neutral positions to the positions 132a, 136a. This slightly greater separation causes the end positions 128m, 130m of the connector beams 128, 130 to be bent slightly away from one another. If the two connector beams 128, 130 are identical, they will both bend by the same amount, and the platform 120 will move in a straight line in the direction of arrows 126, without deviation to one side or the other. This support structure also has the advantage that the pair of flexures such as 132, 134 that support one side of the platform, are spaced far apart so that if one flexure is slightly longer than the other this will not cause appreciable turning of the platform as the platform deflects in the intended direction.

Figure 9:
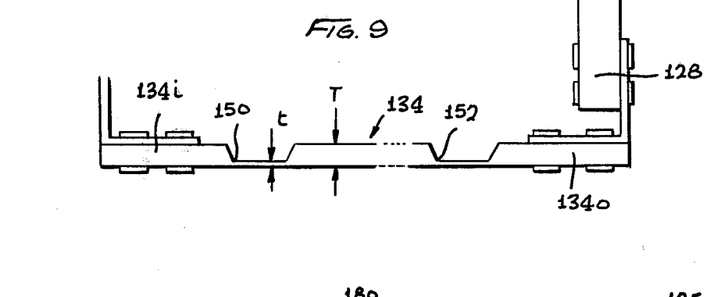
FIG. 9 is a view taken on the line 9—9 of FIG. 7.

In order to maximize the resistance of the flexures such as 134 to twisting, especially when flexed, the flexures are constructed with a considerable width W (FIG. 7). Additional torsional resistance is obtained by making the flexure thick. However, to avoid large resistance to bending resulting from such thickening, notches are formed in the flexure to provide hinge points near the inner and outer ends 134$i$, 134$o$ of the flexure. FIG. 9 shows some of the details of construction of the flexure 134, which has notches 150, 152 formed near its opposite ends, to provide hinge points for low resistance to pivoting in a flexure of considerable width that resists twisting. In one example, the flexure 134 is an aluminum sheet having a thickness T of 3/16th inch, but has a reduced thickness t of 0.020 inch at each of its notches.

The support structure of FIG. 7 includes a frame 160 that can rest on a floor and which supports the inner ends of the four flexures 132-138 securely in position and against pivoting. The other platform 124 which supports the light source, is similarly supported by a pair of connector beams 162, 164 that are, in turn, supported by four flexures 166-172. The upper platform 124 is oscillated by a linear motor 174 fixed to the frame 160, while the lower platform 124 is oscillated by another linear motor 176 that is also fixed to the frame. The reticle is held on an adjustable jig (not shown) on the upper platform, so that the reticle can be positioned with its emulsion plane precisely parallel to the relative motions of the platform.

The support structure of FIG. 7 provides the advantage that the restoring force tending to restore a platform such as 120 to its neutral position when deflected in the direction of either of arrows 126, remains at a relatively low level until the deflection is great, and then the restoring force increases rapidly. This results from the fact that the U-shaped structure 178 formed by the end positions 128$m$, 130$m$ of the connecting members and by the platform 120 that holds them together and against relative rotation with respect to the platform, produces a restoring force in a direction perpendicular to the line of motion along the arrows 126. This restoring force perpendicular to the arrows 126 is converted into a force in the direction of motion (of arrows 126) only to the extent that the flexures 132, 136 are pivoted away from their neutral positions. As the U-shaped structure 178 and the platform 120 approach the end of its travel, as indicated in phantom lines in FIG. 8, not only is the U-shaped structure 178 producing more inward force, but also the angle of each flexure is more effective in converting that force into a force in the direction of motion. Moreover, the force which the connecting member ends 128$m$, 130$m$ produces is proportional to the square of the displacement in the direction of arrows 126, because the U-shaped structure is deflected by the amount by which the circular swing of the flexures 132, 136 differs from a straight line. The result of all of these effects, is that the main restoring force on the platform 120 increases as the cube of its displacement. This non-linear restoring force can be utilized as a "bumper" at the end of its motion, so that the velocity of the platform tends to be relatively constant during the center part of its travel. As a result the linear motor or other device utilized to oscillate the platform 120 can be utilized to apply only a very small force to continue the oscillations at the resonant frequency of the structure, and the structure itself tends to oscillate back and forth with a relatively linear motion along the cener portion of its travel.

Figure 10:
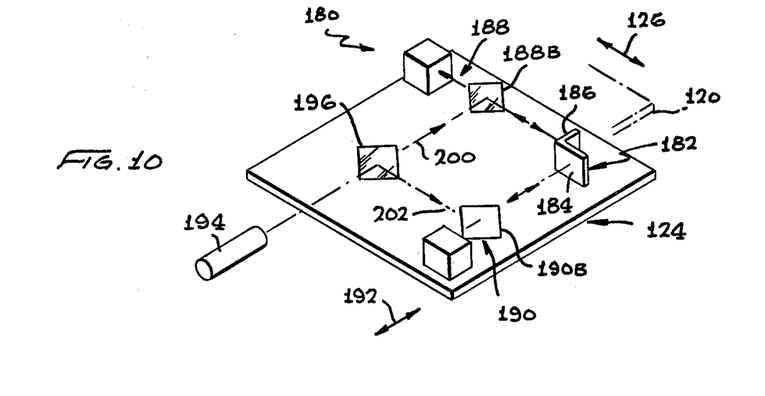
FIG. 10 is a simplified perspective view of the apparatus of FIG. 7, showing the position sensing apparatus thereof.

FIG. 10 illustrates a position sensing apparatus 180 which can be utilized with a support structure such as that shown in FIG. 7, to accurately sense the relative position of the light source with respect to the reticle along two perpendicular lines. The sensing apparatus includes a mirror structure 182 having two mirrors 184, 186 disposed at precisely right angles to one another. The mirror structure 182 is mounted on an upper platform 120 that moves in the direction of arrows 126. The sensing apparatus also includes a pair of interferometers 188, 190 mounted on a lower platform 124 which moves in the direction of arrows 192. A laser light source 194 mounted on the stationary frame of the apparatus, directs a light beam against a beam splitter 196 fixed to the lower platform 124, so that the light is split into two beams 200, 202 that respectively pass towards the interferometers 188, 190. The interferometer 188 includes a beam splitter 188B that directs the beam 200 at the mirror face 186, and the interferometer 188 then senses the reflected beam, to thereby measure variations in the distance between the interferometer 188 and the mirror face 186, which represents motion of the upper platform 120 in the direction of arrows 126. In a similar manner, the other interferometer 190 includes a beam splitter 190B that reflects the beam 202 against the mirror 184, and detects the reflection, to thereby measure variations in the distance between the interferometer 190 and the mirror face 184, which represents relative motion of the upper and lower platforms in the direction of arrows 192. A Hewlett Parkard 5526A interferometer laser measurement system can be utilized to construct the sensing system.

The fact that the two mirror faces 184, 186 are mounted on the same optical element 182 means that they can be kept at precisely right angles to one another, so that the two interferometers 188, 190 measure only the motions of the two platforms in directions precisely at right angles to one another. Thus, even if the two platforms 120, 124 actually move in directions not precisely perpendicular to one another, such as by one half degree more or less than 90°, this will not appreciably affect the very precise production of a reticle. The computer will sense the actual relative positions of the reticle to the light source along a precisely perpendicular coordinate system, and will energize the light source only when it is actually positioned opposite the points of the reticle that are to be exposed. The beams travelling from the mirror faces 184, 186 to the interferometers, are preferably positioned in the plane of the reticle, to minimize errors due to unexpected deflections.

In one system which has been designed for producing reticles for use in the manufacture of integrated circuits, the reticles to be constructed were of five inches square, with a four-inch square area thereon to be utilized in constructing the circuit, and with the reticle being ten times (in linear dimensions) the size of the final circuit to be constructed. The scanning raster was designed to cover points spaced 10 microns apart. Thus, the scanning raster could be defined by 10,000 points in the X direiction and 10,000 points in the Y direction (a total of 100 million points), with adjacent points spaced 10 microns aparts, to cover the approximately four-inch by four-inch square utilized area of the reticle. The reticle was designed to be oscillated at a speed wherein it required approximately one second for the reticle to pass from one side of its motion to the opposite side, with another second required for the return. The light source was designed to be advanced by a distance of 10 microns every second, so that it required about 10,000 seconds or about 3 hours to complete a reticle. Greater accuracy in positioning the exposed points can be achieved by using a finer raster with overlap, although this increases the production time. The time can be decreased by using multiple light sources. Since the light source moves from one point to the next in one ten thousandth of a second, or 100 usec, the light source was designed to be pulsed on for a period such as one tenth of the time required to move from one point to the next, or about 10 microseconds. Since LEDs are available that can be switched in about 0.1 usec, energization of the light source to cover small spots can be easily accomplished. An LED also provides a narrow frequency band of light, which facilitates the design of a lens to produce a desired distribution of light along the width of a narrow beam of the light source.

The gapless scanning pattern that can be executed by the noise free flexure structure of the invention, enables the exposure of a reticle in a resonable time period. If there were even a small percentage of gaps in the scanning pattern which passes over perhaps 100 million potential exposeable points on the reticle (of which perhaps 10% are to be exposed) then it might take an inordinate amount of time to later reach each of the left-out points individually. This is because during raster exposure with one platform oscillating once a second, up to 10,000 points per second can be exposed, and yet it could take several seconds to move the reticle and light source to reach each particular point on the reticle in filling in gaps. Of course, if there are large areas of the reticle where there are no points to be exposed, then it is not necessary to scan those areas.

It may be noted that the term "moving a light source relative to a reticle," includes the situation where either or both of them move, such as where only the reticle moves or where mirrors are used to deflect the beam from a stationary LED. The light source can be an electromagnetic radiation source of any wavelength, including not only visible light but also shorted wavelengths such as X rays. Particle beams such as electron beams are not normally useful because they require the equipment to lie in a vacuum chamber.

Thus, the invention provides a method and apparatus which can be utilized in the production of reticles or other devices which require high precision positioning of a light source with respect to the reticle or other work piece, in a relatively low cost manner. This is accomplished by the use of a system wherein the moving mechanism is designed primarily for smooth noise-free motion, rather than for high accuracy in all movements. High precision is achieved by the use of a position sensing system, such as a laser interferometer system, for sensing the relative positions of the light source and work piece with great precision. An apparatus for exposing a reticle includes a support for moving the light source relative to the reticle in a scanning pattern such as an X/Y raster, an interferometer system for accurately sensing the relative positions of the light source and reticle in X and Y directions, and a computer which senses when the relative positions correspond to those locations at which the reticle must be exposed, to then energize the light source. Although the system is especially useful in the production of reticles, it can be utilized in any application wherein a tool that applies relatively low forces to a work piece, such as a laser or other light source, must be moved relative to a work piece, and wherein the laser or other tool must be applied at precisely located positions on the work piece. The invention provides a support structure which enables the movement of objects in a noise-free manner, by the use of flexures, and which can be constructed to provide motion in a straight line and with relatively uniform velocity along the center of motion.

Although particular embodiments of the invention have been described and illustrated herein, it is recognized that modifications and variations may readily occur to those skilled in the art and consequently, it is intended that the claims be interpreted to cover such modifications and equivalents.

The embodiments of the invention in which an exclusive property or privilege is claimed are defined as follows:

1. Apparatus for forming an integrated circuit comprising:
   a first light source-holding platform;
   a second substrate-holding platform;
   first and second means for moving said platforms in directions largely transverse to each other; and
   a frame for mounting over a floor;
   said first moving means including a pair of resilient sheet-like members extending substantially parallel to each other, each member having inner and outer ends connected respectively to said platform and said frame so that the members flex to permit platform movement, whereby to provide noise-free platform movement.

2. The apparatus described in claim 1 wherein:
   each of said resilient members has reduced thickness notch portions near its inner and outer ends.

3. The apparatus described in claim 1 wherein:
   said resilient sheet-like members are widely spaced apart and lie opposite one another, said first moving means includes a second pair of widely spaced resilient sheet-like members lying opposite one another, and said first moving means also includes a pair of substantially parallel resilient connector beams including a first connector beam having opposite ends connected to the outer ends of said first mentioned pair of members, and a second connector beam having opposite ends connected to the outer ends of said second pair of members, said first platform mounted on said connector beams at locations between their opposite connector beam ends.

4. Apparatus for supporting an object in smooth linear motion, comprising:
   a frame;
   first and second pairs of resilient flexures, including a first pair of spaced parallel flexures lying opposite one another and a second pair of spaced parallel flexures lying opposite one another and parallel to said first flexures, each of said flexures having inner and outer ends with the inner ends of said flexures mounted on said frame;

a pair of resilient connector beams, including a first connector beam having opposite ends coupled to the outer ends of said first members, and a second connector beam having opposite ends coupled to the outer ends of said second members; and means joining middle portions of said pair of connector beams together, whereby to confine the middle portions of the connectors as well as the joining means thereat to linear motion to support an object in linear motion.

5. The apparatus described in claim 4 including:

third and fourth pairs of resilient flexures, including a third pair of spaced parallel flexures lying opposite one another and a fourth pair of spaced parallel flexures lying opposite one another and parallel to said third flexures, each flexure including inner ends mounted on said frame;

a second pair of resilient connector beams including a third connector beam having opposite ends coupled to the outer ends of said third flexures, and a fourth connector having opposite ends coupled to the outer ends of said fourth flexures; and second means joining together middle portions of said second pair of connectors;

said first mentioned and second joining means lying substantially opposite each other, whereby to enable smooth motion in perpendicular directions.

6. The apparatus described in claim 4 including a light source forming said object, mounted on said first joining means;

a first actuator mounted on said frame and coupled to said first joining means to move it parallel to an imaginary line connecting said first connector beam ends, and a second actuator mounted on said frame and coupled to said second joining means to move it parallel to an imaginary line connecting said third connector beam ends.

7. A method for forming a precision pattern in a work piece, comprising:

moving an energizable tool relative to said work piece;

accurately sensing the position of the tool relative to the workpiece along at least two perpendicular directions; and energizing the tool to apply it to locations on the work piece only when the tool is at predetermined locations, as measured along both of said directions, relative to the work piece;

said step of energizing being performed while said tool continues to move relative to said work piece.

8. The method described in claim 7 wherein:

said tool comprises a light source, and said work piece has a photosensitive surface.

9. The method described in claim 7 wherein:

said step of moving said tool relative to said work piece includes oscillating one of them along a substantially line path, and more slowly moving the other of them largely perpendicular thereto, to generate a largely X-Y raster pattern of relative movement.

10. Apparatus for forming an integrated circuit pattern on a photosensitive surface of a substrate, comprising:

an energizable narrow beam light source;

means for moving said light source relative to said substrate;

means for sensing the relative position of said source and substrate; and means responsive to the relative position of said light source and substrate sensed by said sensing means, for energizing said light source while said light source continues to move relative to said substrate;

said means for moving said light source to said substrate including a frame;

first and second pairs of resilient flexures, including a first pair of spaced parallel flexures lying opposite one another and a second pair of spaced parallel flexures lying opposite one another and parallel to said first flexures, each of said flexures having inner and outer ends with the inner ends of said flexures mounted on said frame;

a pair of resilient connector beams including a first connector beam having opposite ends coupled to the outer ends of said second members;

means joining middle portions of said pair of connector beams together and supporting said substrate; and means for moving said light source substantially perpendicular to the motion of said substrate.

11. Apparatus for forming a pattern on a photosensitive surface of a substrate, comprising:

an energizable narrow beam light source;

means for moving said light source relative to said substrate;

means for sensing the relative position of said source and substrate along at least two perpendicular directions, said sensing means generating signals repesenting the coordinates of said source relative to said substrate along each of said directions; and means responsive to the relative position of said light source and substrate sensed by said sensing means, for operating said light source to direct a light beam at said substrate while said light source continues to move relative to said substrate, only at selected pairs of said coordinates.

12. Apparatus for forming a preicision pattern on a work piece, comprising:

source means controllable to apply a narrow beam of radiation;

means for moving said source means relative to said work piece;

means for sensing the relative position of said source means and work piece in at least two directions; and means responsive to the relative position of said source means and work piece sensed by said sensing means, for operating said source means while said source means continues to move relative to said work piece;

said means for operating said source means including memory means containing the pairs of coordinates of locations along a pattern to be formed on the work piece surface, and means for energizing said source means when said sensing means senses said coordinates.

* * * * *